United States Patent [19]

McCormack et al.

[11] Patent Number: 5,677,564
[45] Date of Patent: Oct. 14, 1997

[54] SHALLOW TRENCH ISOLATION IN INTEGRATED CIRCUITS

[75] Inventors: Stephen R. McCormack; Christine H. Chiacchia, both of Colorado Springs; Patrick J. Kelleher, Monument, all of Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 736,651

[22] Filed: Aug. 21, 1996

Related U.S. Application Data

[60] Continuation of Ser. No. 455,592, May 31, 1995, abandoned, which is a division of Ser. No. 160,983, Dec. 1, 1993, abandoned.

[51] Int. Cl.$^6$ ............................................. H01L 29/00
[52] U.S. Cl. ..................... 257/522; 257/499; 257/620; 257/622
[58] Field of Search ..................... 257/499, 505, 257/522, 523, 618, 620, 622; 437/65, 66

[56] References Cited

U.S. PATENT DOCUMENTS

| | | | |
|---|---|---|---|
| 3,054,709 | 9/1962 | Freestone et al. | 257/620 |
| 3,440,717 | 4/1969 | Hill | 257/620 |
| 4,472,240 | 9/1984 | Kameyama | 156/648 |
| 4,827,325 | 5/1989 | Or-Bach et al. | 257/529 |
| 4,906,585 | 3/1990 | Neppl et al. | 437/34 |
| 5,094,973 | 3/1992 | Pang | 437/67 |
| 5,106,770 | 4/1992 | Bulat et al. | 437/40 |
| 5,162,254 | 11/1992 | Usui et al. | 437/63 |
| 5,294,562 | 3/1994 | Lur et al. | 437/67 |
| 5,459,099 | 10/1995 | Hsu | 437/180 |

FOREIGN PATENT DOCUMENTS

| | | | |
|---|---|---|---|
| 59-126664 | 7/1984 | Japan | 257/505 |
| 61-89633 | 5/1986 | Japan. | |
| 1-136328 | 5/1989 | Japan. | |

OTHER PUBLICATIONS

Silicon Processing for the VLSI Era; Stanley Wolf; vol. 2: Process Integration; 1990; pp. 211 and 273.
Silicon Processing for the VLSI Era, Stanley Wolf; Voluem 2: Process Integratino; 1990; pp. 45–50.
Recessed Oxide Isolation Having a Planar Surface; A.J. Jimenez; IBM Technical Disclosure Bulletin; vol. 26, No. 9; Feb. 1984; p. 4787.
A Bird's–Beak–Free Sealed–Interface Local Oxidation Technology for Submicron Ultra–Large–Scale Integrated Circuits; V.K. Dwivedi; J. Electrochem. Soc., vol. 137, No. 8, Aug. 1990; pp. 2586–2588.
Locos Devices; E. Kooi et al.; Philips Research Reports, Jun. 1971, Netherlands, vol. 26, NR. 3; pp. 166–180.
Formation of Submicron Silicon–on–Insulator Structures by Lateral Oxidation of Substrate–Silicon Islandss; Susanne C. Arney et al; Journal of Vacuum Science & Technology B 6 (1); Jan./Feb. 1988; pp. 341–345.

*Primary Examiner*—J. Carroll
*Attorney, Agent, or Firm*—Wayne P. Bailey

[57] ABSTRACT

The invention concerns fabrication of oxide-filled isolation trenches in integrated circuits. The invention etches a network of trenches in the surface of a uniformly doped wafer which has experienced no substantial processing steps. Such a wafer will have little, if any, surface damage. Such a wafer will etch to the same depth everywhere, because two major factors which affect etching rate are (a) surface damage and (b) doping non-uniformity, and these factors are absent. The trenches are then filled with oxide. They define islands upon which devices (such as transistors) may now be fabricated.

5 Claims, 8 Drawing Sheets

SHALLOW TRENCH ISOLATION IN INTEGRATED CIRCUITS

This is a continuation of application Ser. No. 08/455,592 filed on May 31, 1995, abandoned, which is a divisional of application Ser. No. 08/160,983 filed Dec. 1, 1993, abandoned.

FIG. 1 is highly simplified, and illustrates nine CELLs contained in an integrated circuit (IC). (Interconnections between the CELLs are not shown.) Each CELL contains a completed device, such as a transistor (not shown), which must be electrically insulated from neighboring CELLs. The insulation is indicated by the empty SPACEs, positioned between the devices, and which make up the gridwork 3, indicated in phantom. Points A, B, C, and D indicate corresponding locations.

Gridwork 3 indicates that empty spaces, located in the substrate, are used as insulation. However, in fact, the spaces are not actually empty, but contain structures which facilitate insulation. (One reason for using these structures, rather than merely the silicon which forms the substrate, is that, for a given consumption of area, higher insulation values can be obtained from the structures than from silicon itself.) Several different types of structure are used.

One approach is the use of junction isolation, as shown in FIG. 2. A PN junction, formed between a P+ and N region, is held in a reverse-biased condition, and acts as an extremely high resistance, or insulator.

Another approach, shown in FIG. 3, is to use TRENCHes filled with specific dielectrics, which act as insulators. The TRENCHes can be configured into the pattern of the gridwork 3 in FIG. 1. The structure labeled 6 in FIG. 3 undergoes further processing, as indicated, in order to form a completed device.

Yet another approach is shown in FIG. 4, wherein V-GROOVEs are used. A specific type of V-groove approach is shown in the sequence of FIG. 5. In FIG. 5A, deep V-GROOVEs are etched into the surface of <100> silicon. An N+ diffusion is undertaken, followed by growth of a silicon dioxide layer on the surface, producing the N+ region and the silicon dioxide layer shown in FIG. 5B.

In FIG. 5B, a thick layer of polysilicon is deposited upon the silicon dioxide. Then, the back (ie, the bottom part of the wafer shown in FIG. 5B) is abraded away in a lapping process. The wafer is then flipped over, and transistors are fabricated on the new surface S which was created by the lappping operation, resulting in the structure shown in FIG. 5C.

Thin Isolation Trenches are Sometimes Necessary

The prior art approaches of FIGS. 3, 4, and 5, produce deep trenches (ie, deeper than 1.0 micron). In some fabrication processes, very shallow isolation trenches are required (eg, in the range of 0.1–0.3 micrometers in depth). Further, these shallow trenches must have uniform depths, because they are later filled with oxide, and the finished oxide must be level with the surface of the wafer.

For example, as a rough approximation, assume that, during a given oxidation step, all shallow trenches in a given wafer become filled with the same depth of oxide, namely, a depth of 0.1 micron. If a TRENCH is too deep, as FIG. 6 illustrates, the oxide will not reach the SURFACE of the wafer. On the other hand, if a TRENCH is too shallow, the oxide will form a mound above the SURFACE, as FIG. 6 indicates. Both cases fail to meet the requirements: in neither case is the oxide level with the SURFACE. Thus, variations in trench depth cause the oxide to be non-level with the SURFACE, and cause problems in yield and reliability.

Depth variations are caused by numerous factors, which affect the chemical etching process by which the trenches are formed. One factor is surface damage in the etched region. Particle implantation causes surface damage.

Thus, the etching rate will probably be different in a region where implantation has occurred, as compared with a non-implanted region. Consequently, the same etching step will produce trenches of different depths in the two regions.

Other factors include the following three: (1) conductivity of the material to be etched, (2) the dopant type of the material to be etched, and (3) the dopant concentration of the material to be etched. If one or more of these factors differ in two different regions of the wafer, the regions will probably experience different etch rates. Again, the same etching step will produce trenches of different depths in the two regions.

Therefore, as a specific example, if a trench is etched into a wafer containing both an N-type region and a P-type region, as shown in FIG. 7, the trench will probably have different depths in the two regions, as indicated. This depth variation is unacceptable for the use of shallow trench isolation.

OBJECTS OF THE INVENTION

An object of the invention is to provide an improved trench formation process.

A further object of the invention is to provide a trench formation process in integrated circuits which creates shallow trenches of uniform depth.

SUMMARY OF THE INVENTION

In one form of the invention, the first structures fabricated on a wafer are isolation trenches, which are then filled with oxide. Then, devices are fabricated within the cells bordered by the isolation trenches.

Figure 5A:
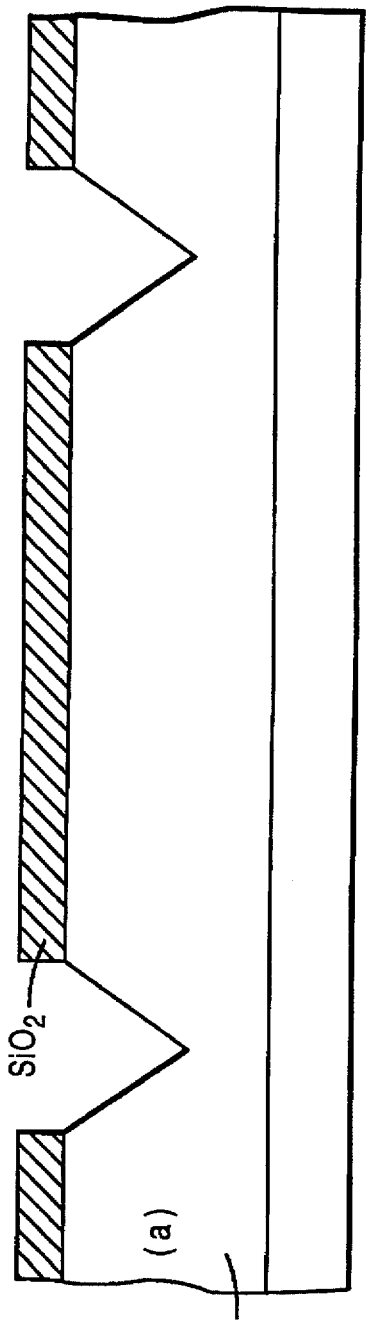
Figure 5B:
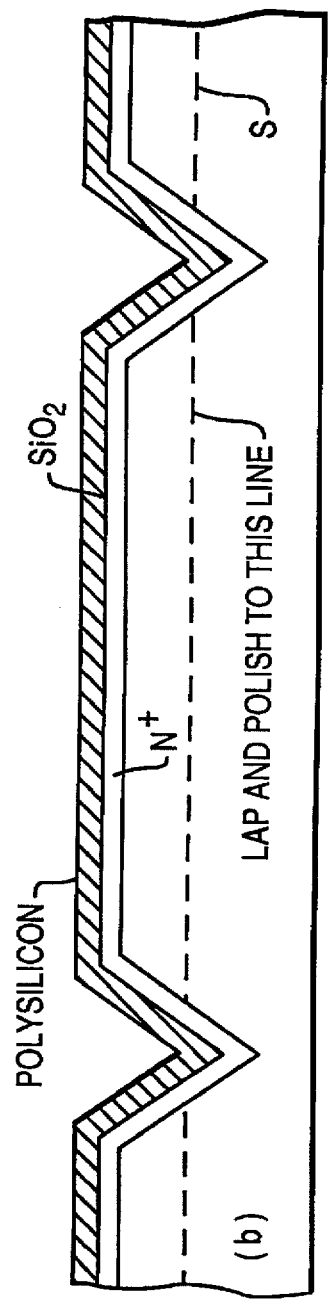
Figure 5C:
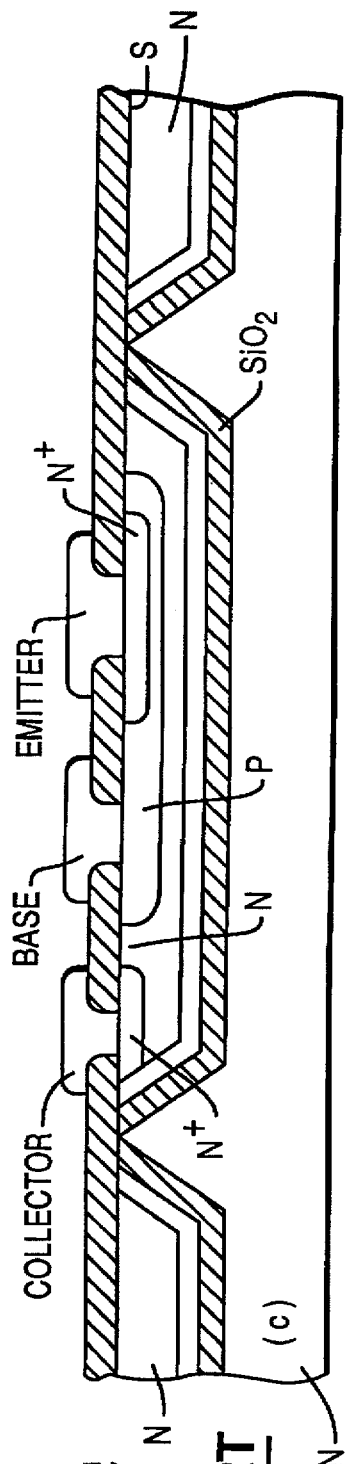

The sequence of FIGS. 5A–5C illustrate a specific type of V-groove isolation.

Figure 6:
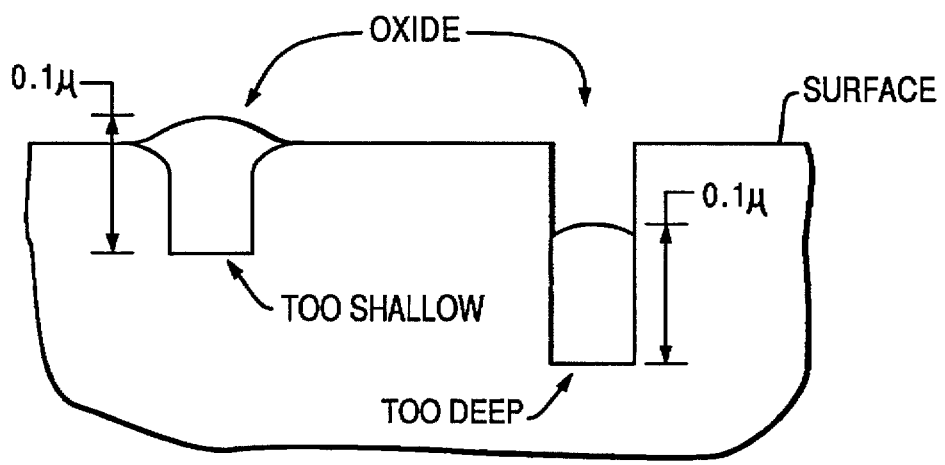

FIG. 6 illustrates how trenches of different depths produce different oxide configurations.

Figure 7:
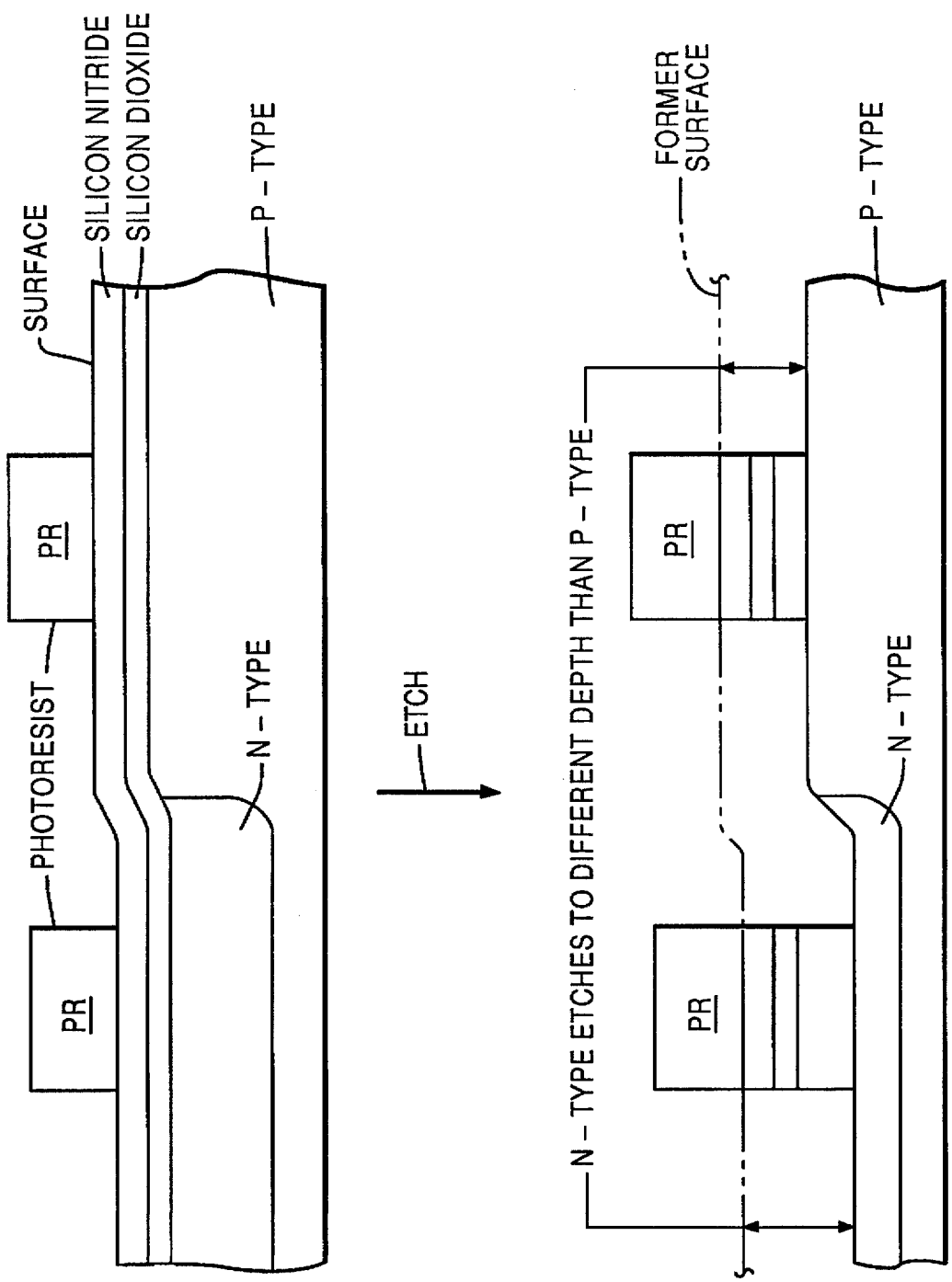

FIG. 7 illustrates how an N- type region can etch differently than does a P-type region.

Figure 8:
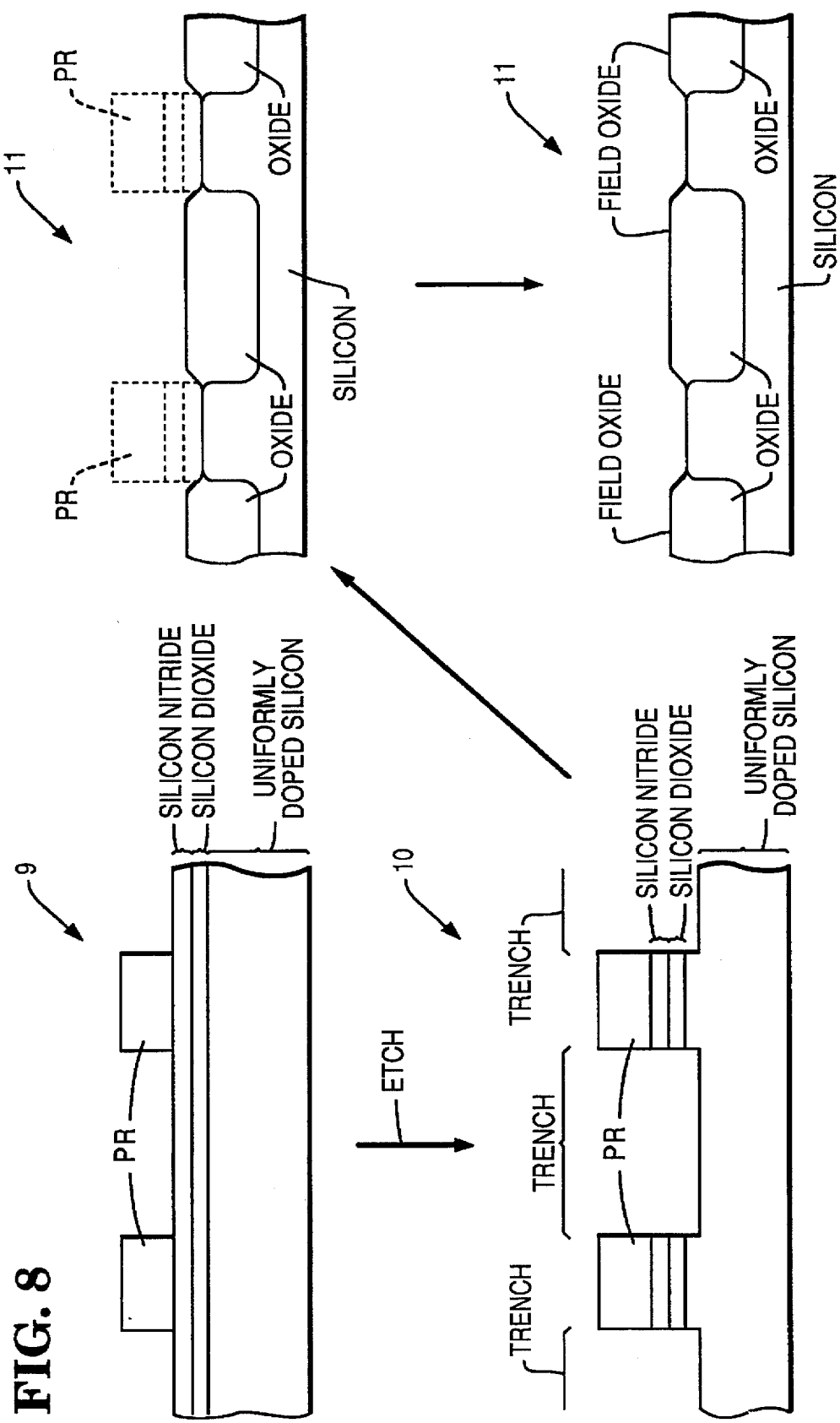

FIG. 8 illustrates a sequence of processing steps used by the invention.

Figure 9:
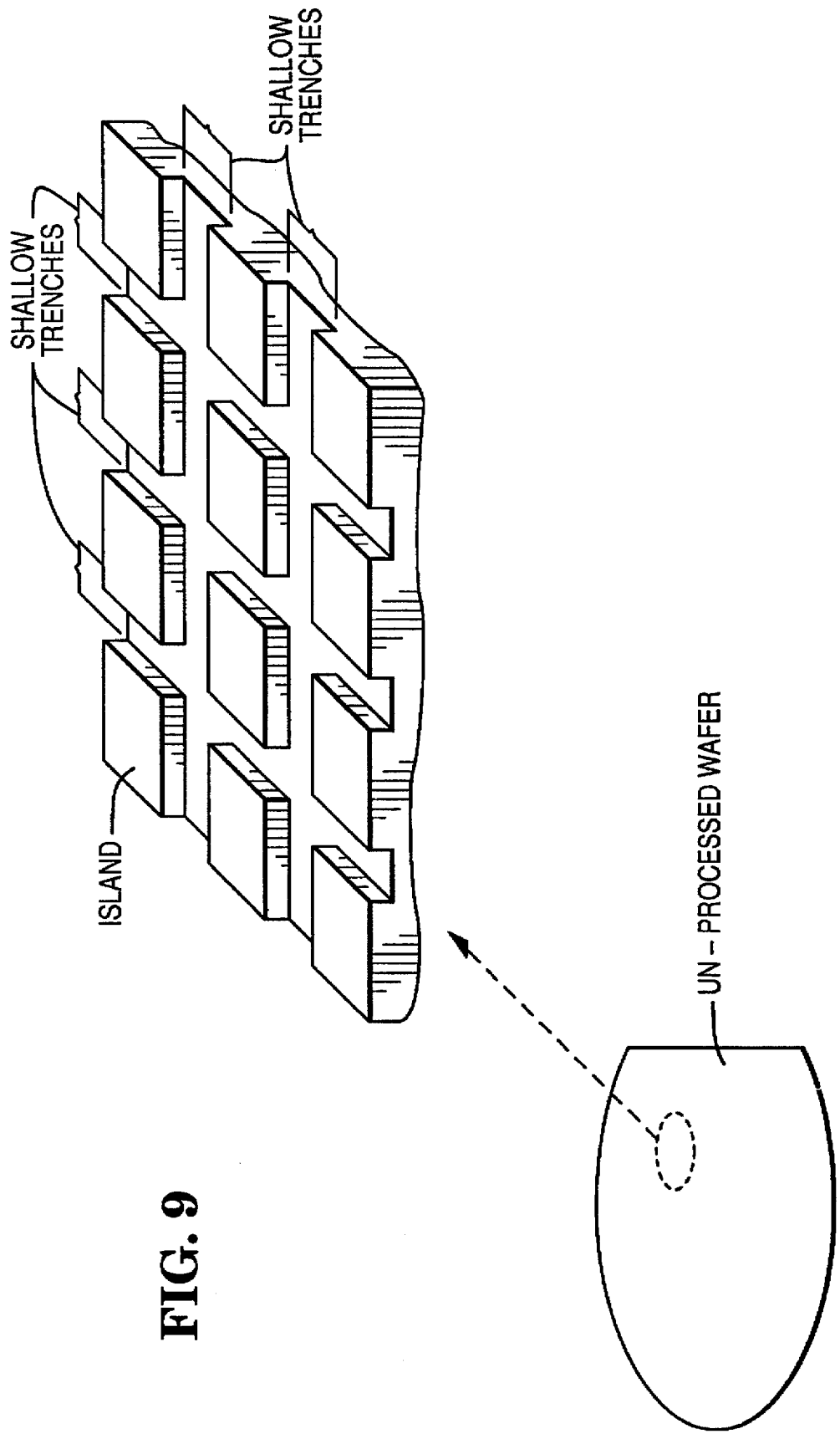

FIG. 9 illustrates a system of shallow trenches which the invention produces. The trenches are contained in a wafer in which no other structures have been fabricated.

DETAILED DESCRIPTION OF THE INVENTION

Figure 1:
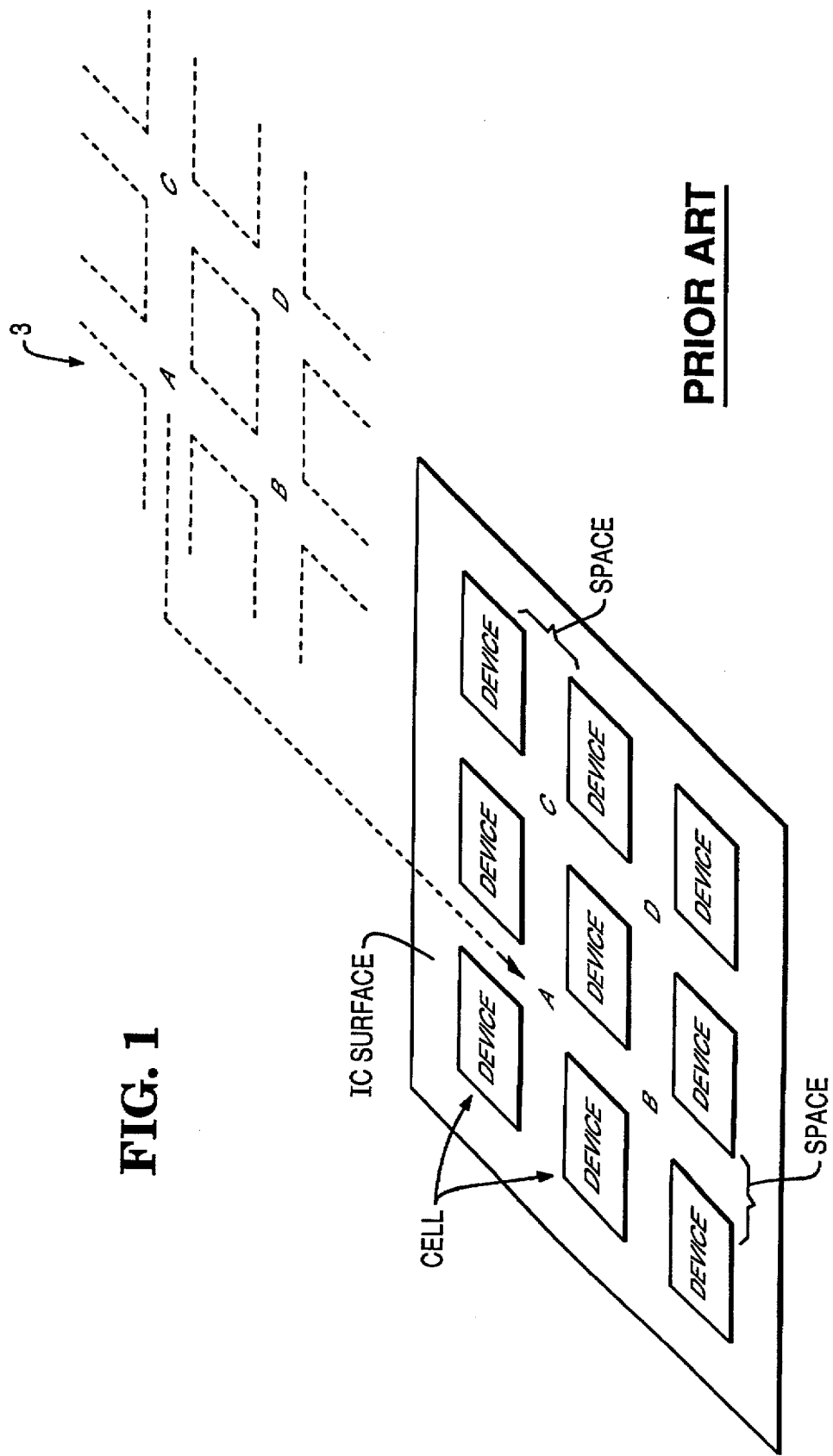
FIG. 1 illustrates isolation between CELLs in an integrated circuit.
Figure 2:
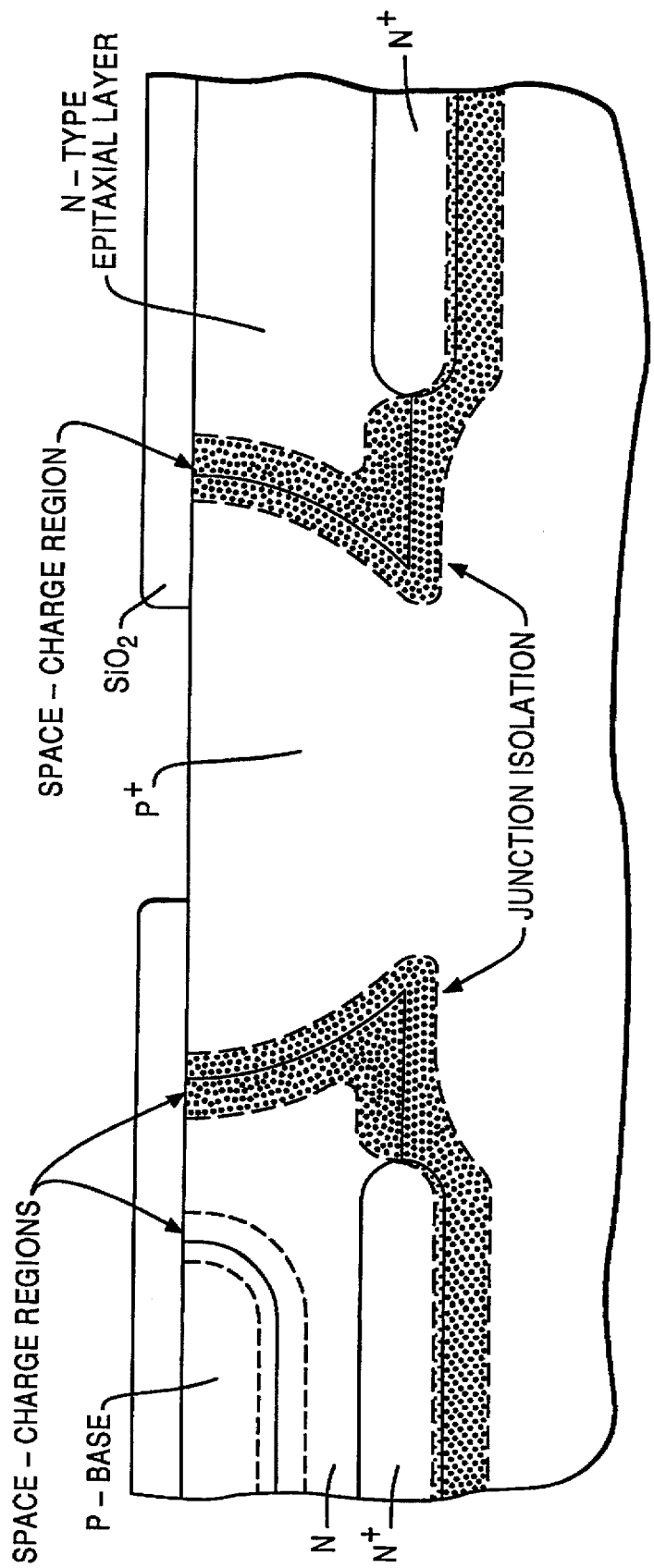
FIG. 2 illustrates junction isolation.
Figure 3:
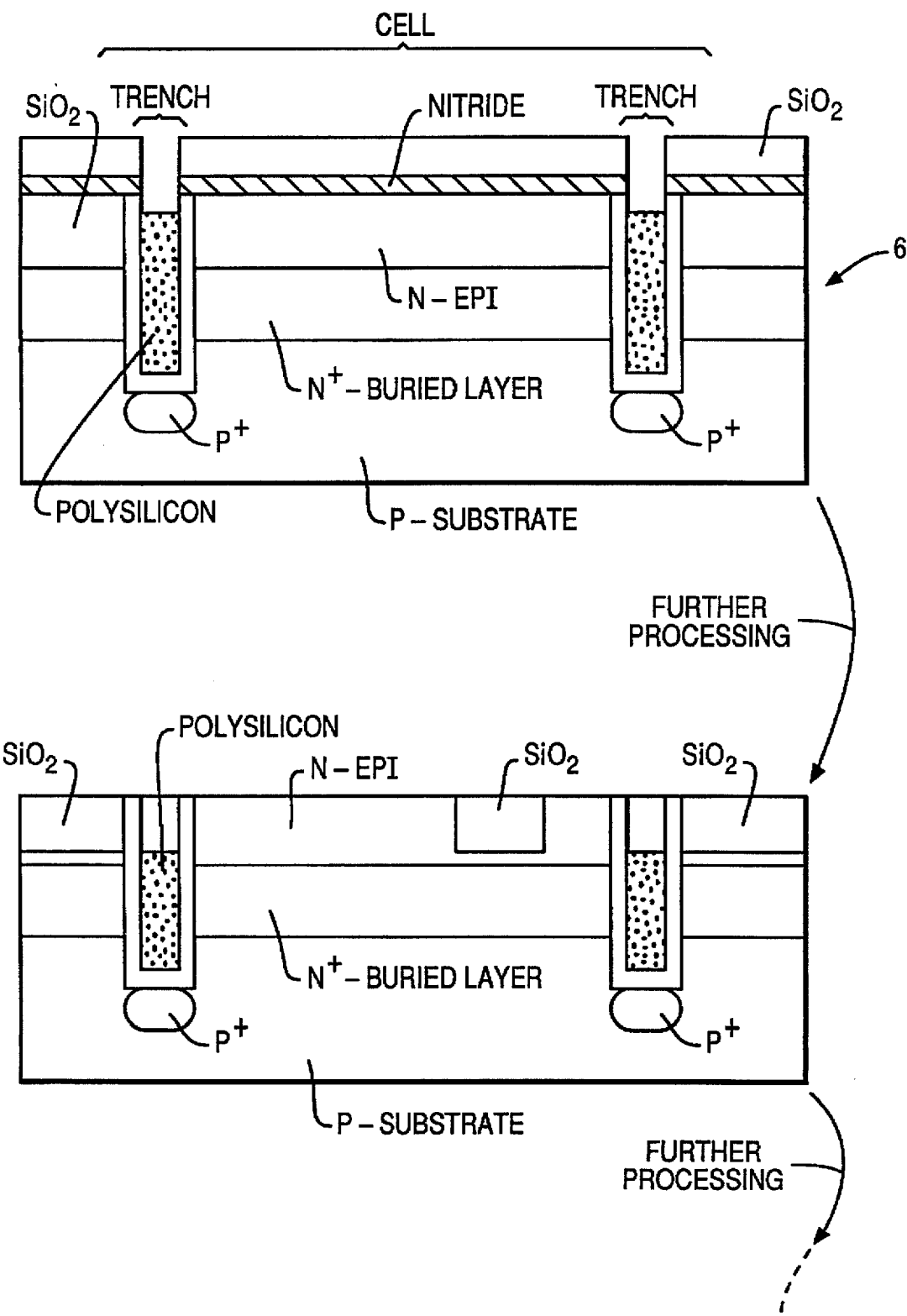
FIG. 3 illustrates trench isolation.
Figure 4:
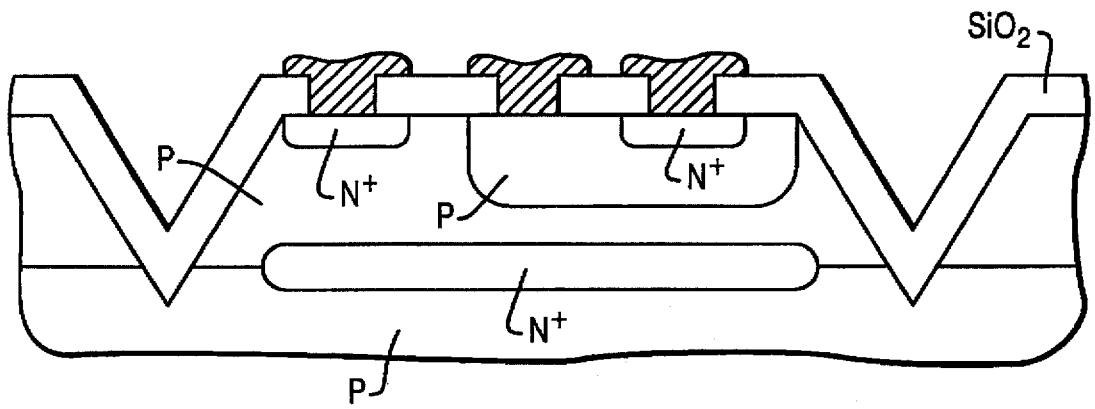
FIG. 4 illustrates V-groove isolation.

A layer of silicon dioxide, and a layer of silicon nitride are applied to a wafer, using known process steps. FIG. 8 shows the layers. A pattern of PHOTORESIST is applied. The PHOTORESIST defines the areas which are to be protected from etching. That is, each photoresist island PR covers a cell which will eventually contain a device. Such CELLs are shown in FIG. 1.

The structure 9 of FIG. 8 is subjected to an etch, which produces the structure 10 having the TRENCHes indicated.

Suitable etchants are known in the art. Field oxide is grown in the TRENCHes of structure 10, producing structure 11. Growth of field oxide is known in the art.

The photoresist islands PR, the silicon nitride layers, and the silicon dioxide layers are removed, as indicated by the phantom lines in structure 11. The phantom lines show the relative locations of oxide growth. The resulting structure 11 is shown at the lower right part of FIG. 8, without the phantom islands and layers.

In one embodiment, the CELLs are laid out on a cartesian grid, uniformly spaced, thereby locating the shallow trenches between the CELLs. In other embodiments, the layout of the CELLs will depend on the specific integrated circuit to be ultimately fabricated, and the layout of the shallow trenches will not be on a cartesian grid, but will accommodate the layout of the CELLs.

The invention produces a trench system, shown in FIG. 9, which is uniform in depth, because the substrate which was subjected to the etching process is uniform in characteristics: no fabrication steps (apart from possible cleaning) have been taken. There is no implantation damage, nor differential in doping or in conductivity across the substrate.

Significant Features

1. Typically, a manufacturer of ICs purchases wafers from a supplier; the manufacturer, in general, does not produce its own wafers. FIG. 9 shows a wafer on which a shallow trench system has been fabricated. The shallow trench system is the first structure fabricated on the wafer received from the supplier, prior to any other structures.

These wafers arrive from the supplier in a nearly defect-free condition. The surfaces are highly polished, and almost flawless. The IC manufacturer uses such wafers directly for IC fabrication without further preparation (apart from possible cleaning).

The quality of such wafers is called "incoming wafer quality." The invention applies the shallow-trench-fabrication steps outlined above to such wafers, before implantation and before other changes in doping are undertaken.

By forming the trenches prior to implantation, the invention avoids the problems of etching implant-damaged surfaces. By forming the trenches prior to other doping changes, the invention avoids the problems of etching a surface containing regions which differ in (a) conductivity, (b) dopant type, or (c) dopant concentration.

It is not necessary that no processing steps whatsoever be undertaken prior to fabrication of the trenches of the invention. The invention will tolerate processing such as nitridation and oxidation. However, prior to applying the inventive steps to the wafer, the wafer is preferably subjected to no temperatures higher than 950 C. Further, if the wafer is subjected to temperatures in excess of 900 C., then for no longer than one hour.

2. The trenches are fabricated upon a substrate having uniform conductivity and uniform doping. The doping was achieved by a diffusion process, so that implantation damage is not present. This doping is generally undertaken by the wafer supplier, although diffusion by the IC manufacturer is not precluded.

3. The phrase "incoming wafer quality" was used above, to described the surface of the wafer processed by the invention. Some parameters for defining the quality of this surface are the following:

A. Incoming wafers, or a sample of an incoming batch, are commonly etched, in a test procedure, or as part of an initial cleaning procedure. If a defect is present, such as a stacking fault, the etching will decorate the defect, causing it to stand out. A maximum of one defect per square centimeter is allowed.

Later processing will probably induce defects which exceed this limit.

B. Another parameter is based on the fact that implantation causes the objectionable damage. The shallow trenches shown in FIG. 9 are formed in a wafer which has experienced substantially no implantation.

Implantation damage can be annealed out, but not completely. Thus, it is preferred that the SHALLOW TRENCHes in FIG. 9 be fabricated in surfaces which have experienced no implantation damage, or, at least, in surfaces in which no substantial implantation damage remains.

C. Another parameter is the requirement that no processing has been undertaken which would cause surface defects, in excess of the number identified in (A), above, nor scratches.

D. The incoming wafers can contain a layer of epitaxial silicon. In this case, the UNIFORMLY DOPED SILICON in FIG. 8 represents an epitaxial layer. The trenches of the invention can be fabricated in this layer. The epitaxial layer must meet the defect limit stated in (A), above.

It is noted that epitaxial deposition can be a high temperature process, exceeding the time-temperature limits stated in (1), above. Epitaxial deposition is an exception to these limits.

Also, epitaxial deposition is a fabrication step. Thus, when an epitaxial layer is used, the shallow trenches are not the first structures fabricated on the wafer.

4. As stated above, the invention concerns shallow trenches, which typically lie in the range of 0.05 to 0.3 microns deep, and are, certainly, no deeper than 0.5 microns. In contrast, deep trenches are defined in the art as exceeding 1.0 microns.

5. One form of the invention is the precursor structure shown in FIG. 9. The precursor contains ISLANDs, which correspond to the CELLs of FIG. 1. Each ISLAND-CELL of FIG. 9 will later contain one or more devices (such as transistors) of which the overall integrated circuit will be comprised.

The ISLANDs are isolated from each other by the SHALLOW TRENCHes, which are filled with oxide (or other dielectric in a later processing step.

6. The concept of uniform depth in trenches was discussed above. A variation in depth of ten percent, or less, qualifies a depth as "uniform." For example, a trench which is nominally 0.1 microns deep must be no deeper than 0.11 microns, and no shallower than 0.09 microns.

7. In the Background of the Invention, the term "filling" trenches with oxide was used. This term is used in a non-technical sense, and does not specify a particular method of oxide cormation.

8. The fabrication steps for the devices to be located in the ISLANDs shown in FIG. 9 will certainly require masking. The term "masking" is known in the art, and includes the selective hardening of a material, or resist, by selective exposure to light, to electrons, or to some other energy source. The hardened parts are resistant to etching, and protect the underlying material.

The invention fabricates the shallow trench system prior to this masking. Even though the shallow trench system itself involves a masking step, this masking step is prior to any others.

Numerous substitutions and modifications can be undertaken without departing from the true spirit and scope of the invention. What is desired to be secured by Letters Patent is the Invention as defined in the following claims.

We claim:

1. A precursor structure for the fabrication of integrated circuits, comprising:

a plurality of islands, separated from each other by unoxidized trenches which are no deper than 0.3 microns and vary in depth by no more than ten percent; and no implanted regions in the wafer.

2. A precursor wafer for the fabrication of integrated circuits, comprising:

a network of trenchs which electrically insulate islands of substrate from each other, said trenches being no deeper than 0.3 microns and vary in depth by no more than ten percent; wherein said trenches are unoxidized trenches; and no implantation damage in the wafer.

3. A wafer according to claim 2 and further comprising a layer of epitaxial silicon in which the trenches are formed.

4. A precursor wafer for the fabrication of integrated circuits, comprising:

a network of trenches which electrically insulate islands of substrate from each other, said trenches being no deeper than 0.3 microns and vary in depth by no more than ten percent, wherein said trenches are unoxidized trenches; and no implanted regions in the wafer.

5. A wafer according to claim 4 and further comprising a layer of epitaxial silicon in which the trenches are formed.

* * * * *